United States Patent [19]

Wendler

[11] Patent Number: 4,961,062

[45] Date of Patent: Oct. 2, 1990

[54] CONTINUALLY VARIABLE ANALOG PHASE SHIFTER

[75] Inventor: John P. Wendler, Brighton, Mass.

[73] Assignee: Raytheon Company, Lexington, Mass.

[21] Appl. No.: 364,414

[22] Filed: Jun. 12, 1989

[51] Int. Cl.$^5$ .................. H03H 7/20; H01P 1/185
[52] U.S. Cl. .................. 333/164; 333/139; 333/161
[58] Field of Search .................. 333/161–164, 333/156, 24.1, 158, 246, 138, 139; 307/320, 510, 511; 357/14; 336/200, 232

[56] References Cited

U.S. PATENT DOCUMENTS

| | | | |
|---|---|---|---|
| 3,260,968 | 7/1966 | Drapkin | 333/139 |
| 3,778,733 | 12/1973 | Rizzi | 333/139 |
| 4,450,419 | 5/1984 | Schwarzmann | 333/164 |
| 4,603,310 | 7/1986 | Yarman | 333/164 X |
| 4,604,591 | 8/1986 | Vasile | 333/164 X |
| 4,604,593 | 8/1986 | Yarman | 333/164 X |
| 4,733,203 | 3/1988 | Ayasli | 333/139 |
| 4,837,532 | 6/1989 | Lang | 333/164 |

FOREIGN PATENT DOCUMENTS 0073916  6/1981  Japan .................. 333/156

OTHER PUBLICATIONS

Garver, R. V., "Broad-Band Diode Phase Shifters", IEEE Transactions on Microwave Theory and Techniques, vol. MTT-20, No. 5, May 1972, pp. 314–323.
G. E. Brehm et al., "High Capacitance Ratio Monolithic Varactor Diode", Proc. 8th Biennial Cornell Elec. Engrg. Cons. 1981 Active Microwave Semiconductor Devices and Circuits, pp. 53–63.

*Primary Examiner*—Eugene R. LaRoche
*Assistant Examiner*—Seung Ham
*Attorney, Agent, or Firm*—Denis G. Maloney; Richard M. Sharkansky

[57] ABSTRACT

An analog phase shifter is provided by cascading T high pass filter and $\pi$ low pass filter sections. The low pass filter network is selected to have a cut-off frequency above the highest frequency in a predetermined frequency range of the phase shifter and includes a fixed inductor element as a series element of the network and a pair of variable capacitor elements disposed in shunt between said inductor element and ground. The high pass filter network has a cut-off frequency below the lowest frequency of the predetermined frequency band. The network includes a fixed inductor element disposed as a shunt element of said network and a pair of variable capacitor elements disposed in series. The inductor element is coupled between a common connection of said pair of variable capacitor elements and the reference potential. The $\pi$ network and the T network are cascaded connected between the pair of terminals of the network. The voltage level is fed to each one of the variable capacitor elements and provides a variable capacitance in response thereto and thus imparts to said network a variable phase shift over the operating frequency range of the phase shifter.

14 Claims, 7 Drawing Sheets

CONTINUALLY VARIABLE ANALOG PHASE SHIFTER

BACKGROUND OF THE INVENTION

This invention relates generally to radio frequency circuits and more particular, to radio frequency phase shifters.

As is known in the art, phase shifters are used in a variety of applications to provide a selected phase shift to a signal propagating therethrough. One of the more frequent applications of phase shifters are in transceiver modules (transmit/receive modules) of phased array antennas. Certain applications of phased array antennas require high phase resolution, typically about 0.7° in phase.

One approach to provide high phase resolution has been to cascade multiple sections of digital phase shifters. With a digital phase shifter, each section is selected to provide a differential phase shift bit corresponding to $180°/2^n$, where n is an integer between 1 and i, with i being the last phase shift bit. To provide a phase resolution of 0.7° requires 9 bits or nine cascaded phase shifter sections. This approach is in general not practical because of the increase in insertion loss, noise, and VSWR. Moreover, a chain of nine phase shifter sections would make the phase shifter relatively large and also costly.

An alternative approach in the prior art is to cascade a continuously variable phase shifter with a 3-bit digital phase shifter. The 3-bit digital phase shifter provides 45° of resolution and the variable phase shifter provides a continuous variable phase shift over the range of 0°–45°. Several approaches are known to provide an analog phase shifter having a continually variable phase shift over 0°–45°. Generally such approaches require the use a 90° hybrid. The requirement of a 90° hybrid provides a phase shifter which is physically relatively large and also difficult to fabricate. Such hybrids also have restricted bandwidths which generally are more restricted than the requirement for many applications of such phase shifter circuits. Other approaches which provide variable phase shifters use active devices such as field effect transistors. However, these approaches are non-reciprocal, and it is generally desired in most applications of phase shifters particularly in a phased array that the phase shifters be reciprocal so that the same wavefront can be received on echo as is transmitted from the array without having to change the state of the phase shifters or without requiring extra circuitry to change the direction of signal transmission.

Accordingly, there exist a need for a compact, reciprocal continually variable phase shifter.

It is also known that T/R modules is a phase array often number in the hundreds or thousands. Generally, all of said modules are designed to be identical and to have identical phase delays between a pair of input/output ports thereof. It is generally observed that due to inherent tolerances in manufacturing of said modules that the phase delays between the pair of ports is not identical. Thus, an arrangement is needed to change the pathlength without substantially increasing the size or power consumption of the module.

SUMMARY OF THE INVENTION

In accordance with the present invention, an analog phase shifter includes a low pass $\pi$ network and a high pass T network, with the low pass $\pi$ network comprising a fixed inductance element and a pair of variable capacitance elements as shunt elements of the network, and the high pass T-network comprising a pair of variable capacitance elements connected in series and an inductive element connected as a shunt element of the network. With such an arrangement, a compact reciprocal phase shifter which is continually variable by changing the value of capacitance of each of the variable capacitors is provided. This structure eliminates the need for hybrids or active devices such as FETS. Moreover, this structure is also broadband and provides reciprocal phase shift operation.

In accordance with a further aspect of the present invention, an analog phase shifter operable over a predetermined frequency band having a pair of terminals, includes a low pass filter $\pi$ network having a cut-off frequency above the highest frequency in the predetermined frequency band, cascade connected with a high pass T-network having a cut-off frequency below the lowest frequency in the predetermined frequency band. The low pass filter network includes a fixed inductive element as a series element and a pair of variable capacitive varactor diodes disposed in shunt each connected to an end of said inductance element and coupled to a reference potential. The high pass filter network network includes a fixed inductance element disposed as a shunt element of said network and a pair of variable capacitive varactor diode elements connected in series, with said inductance element coupled between a common connection of said pair of variable capacitive varactor diode elements and the reference potential. Each one of said varactor diodes is fed a D.C. bias to control the capacitance of the element. With such an arrangement, by using variable capacitive varactor diodes as capacitor elements of the network, a relatively large variation in phase shift may be imparted to a signal. This arrangement also provides a compact structure compared to prior techniques.

In accordance with a still further aspect of the present invention, a fixed phase adjusting means includes a network selected from the group consisting of a low pass $\pi$ network and a high pass $\pi$ network. With this arrangement, the variation in phase delay between identically manufactured phased array modules can be eliminated.

BRIEF DESCRIPTION OF THE DRAWINGS

The foregoing features of this invention, as well as the invention itself, may be more fully understood from the following detailed description of the drawings, in which.

Figure 6:
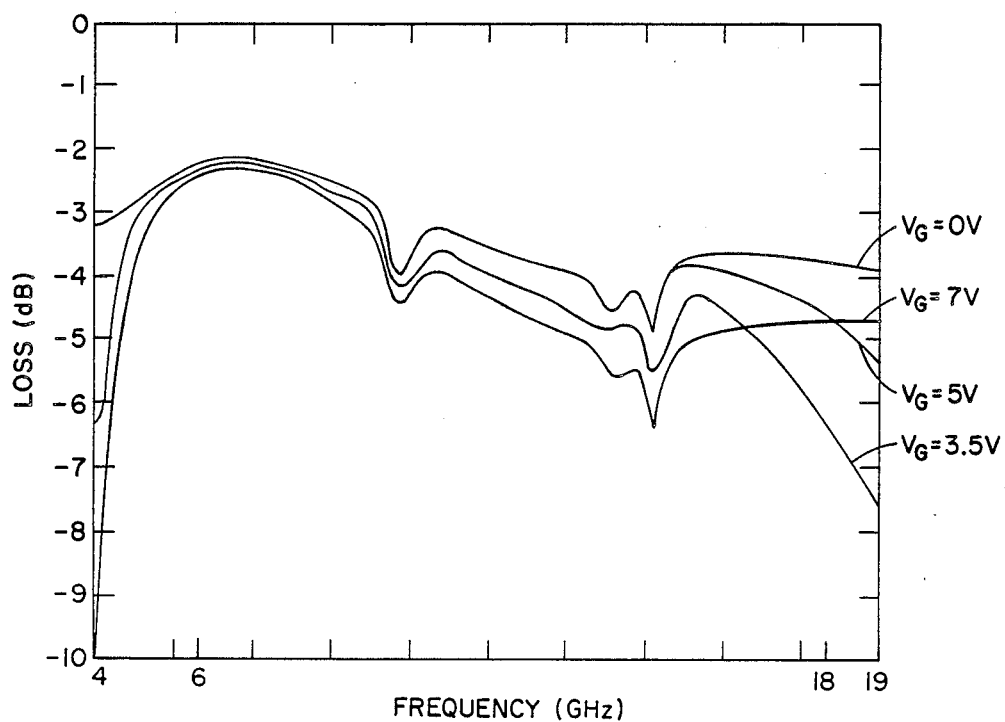
Figure 7:
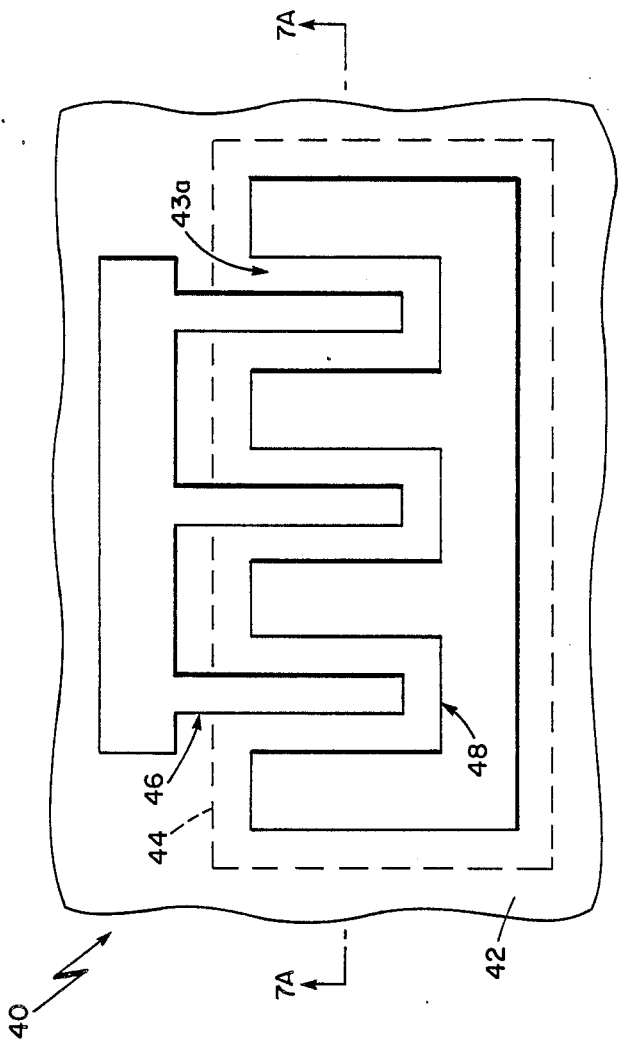
Figure 7A:
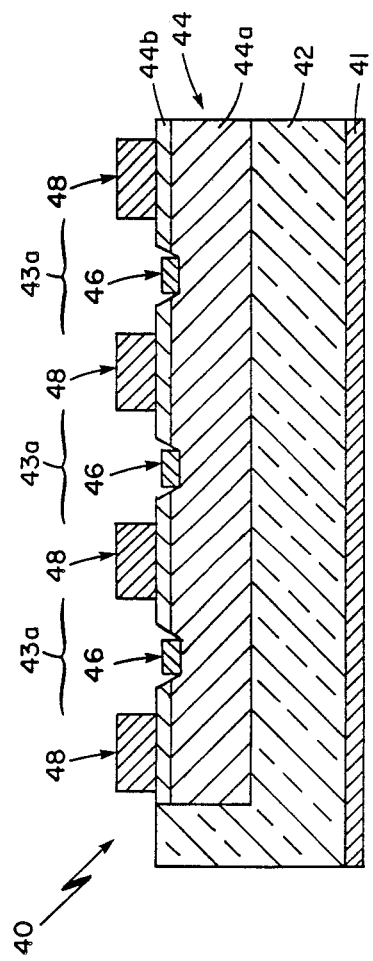

GHz for a network fabricated in accordance with the present invention;

FIG. 6 is a plot showing insertion loss (in dB) as a function of frequency over the frequency range of 6–18 GHz for a circuit fabricated in accordance with the present invention;

FIG. 7 is a plan view of an embodiment of a varactor diode;

FIG. 7A is a cross-sectional view taken along lines 7A—7A of FIG. 7; and

Figure 8:
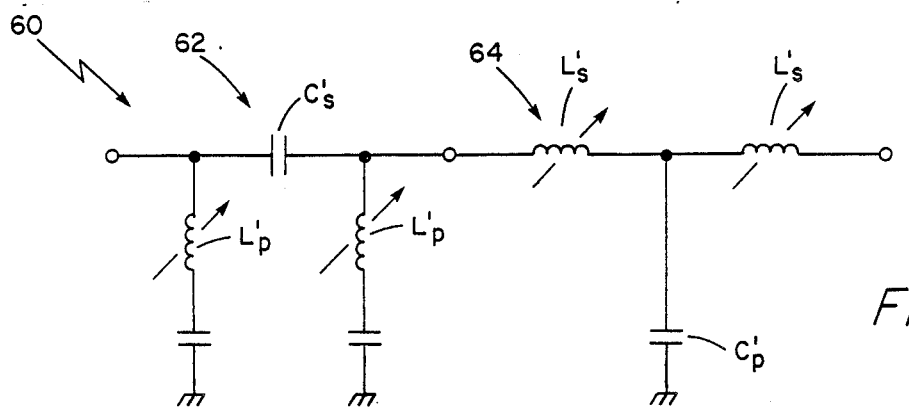
Figure 8A:
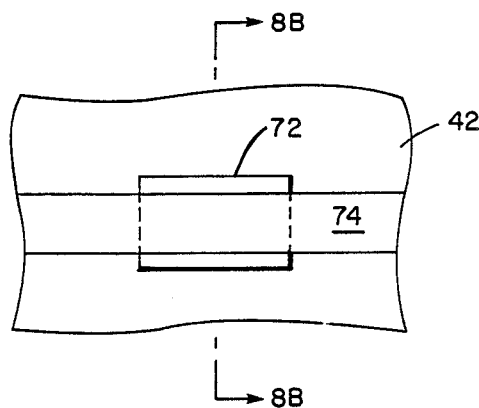
Figure 8B:
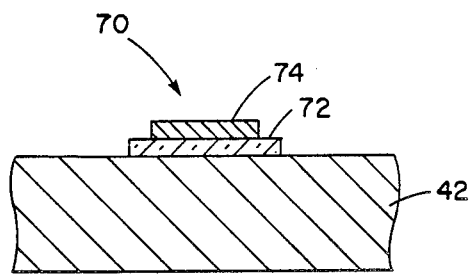

FIGS. 8, 8A and 8B are a schematic of an alternate embodiment of a phase shifter in accordance with the present invention.

DESCRIPTION OF THE PREFERRED EMBODIMENTS

Figure 1:
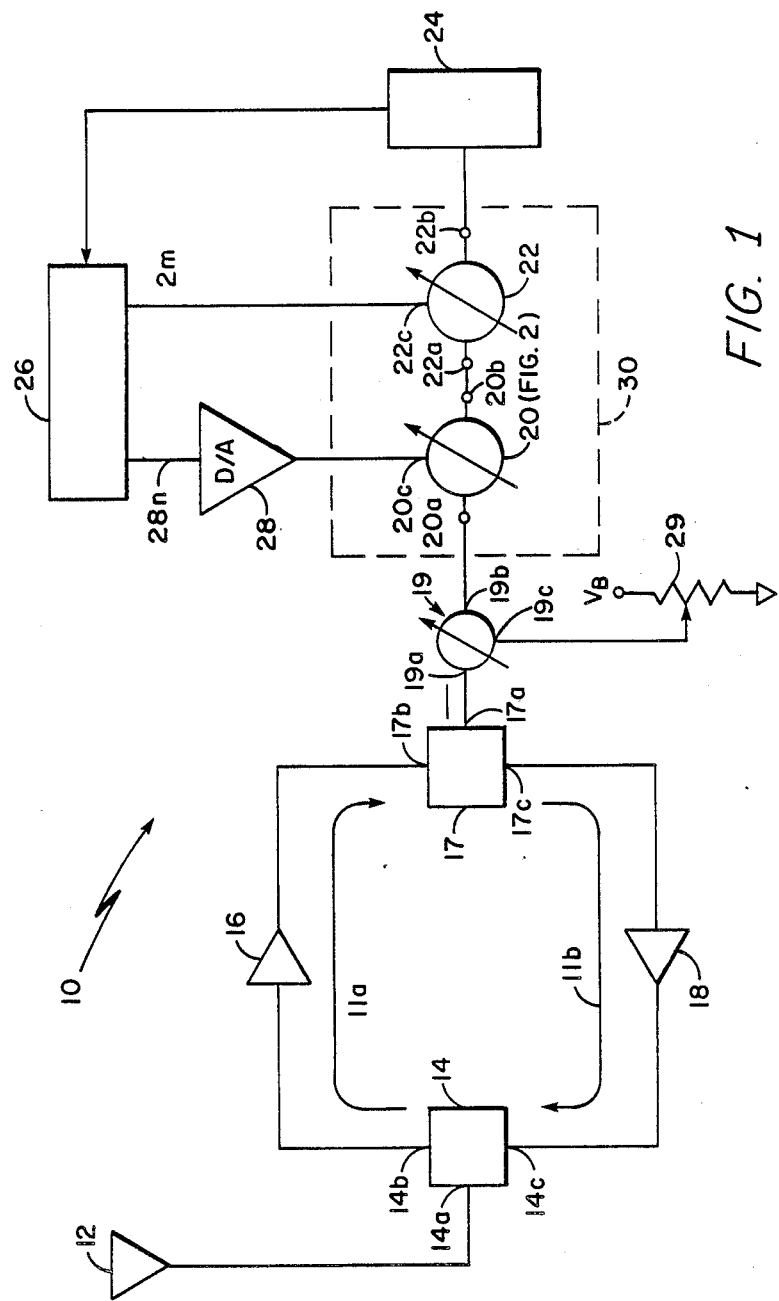
FIG. 1 is a block diagram of a transceiver element using an analog phase shifter in accordance with the present invention.

Referring now to FIG. 1, a transceiver element 10 for use in a phased array (not shown) is shown to include a radiating element 12 coupled to a common port of a single pole, double throw r.f. switch 14. R.F. switch 14 has a pair of branch ports 14b, 14c, with branch port 14b coupled to the input of a low noise amplifier 16 used to amplify a received r.f. signal. Branch port 14c is coupled to the output of high power amplifier 18 used to transmit a high power output signal to the radiating element 12. The output of low noise amplifier 16 is coupled to a branch port 17b of a second single pole, double throw r.f. switch 17, whereas the input port of high power amplifier 18 is coupled to the second branch port 17c of TR switch 17. A common port 17a of TR switch 17 is coupled to a fixed phase adjusting means 19 as will be described hereinafter having its output coupled to a continually variable phase shifter 30.

Continually variable phase shifter 30 includes a first stage 20 as will be described in conjunction with FIG. 2 which is an analog continually variable phase shifter having a pair of input/output ports 20a, 20b as shown. A control port 20c is fed from here a digital/analog converter 28 which is fed digital information along lines 28n from a beam steering controller 26 which in turn is fed information from a radar system 24 as commonly known. The output of the digital analog converter is used to provide a voltage signal to the phase shifter 20 and is thus used to impart a predetermined differential phase shift to a signal propagating therethrough, such that the signal at input/output port 20b will have a predetermined phase shift relative to the signal fed at input/output port 20a. Port 20b of phase shifter 20 is coupled to a first input/output port 22a of here a 3-bit digitally controlled phase shifter 22. Digitally control phase shifter 22 has a second input/output port 22b which is fed to the radar system 24 and a control port 22c which is coupled by here 6 or 2 m lines, where m is the number of bits here equal to 3. The 2 m lines are fed to the digitally control phase shifter to provide the true and complement control bits. Thus, digitally control phase shifter 22 is used to provide 3 bits of accuracy, that is to provide a phase shift which is variable between +45° and 360° in 45° increments. The continually variable analog phase shifter 20 is selected to provide phase shift in the range of 0° to 45°. Thus, the analog phase shifter 20 cascade connected to the 3-bit phase shifter 22, provides a continually variable phase shifter 30 having 0° to 360° of phase shift with continuous phase resolution.

Figure 2:
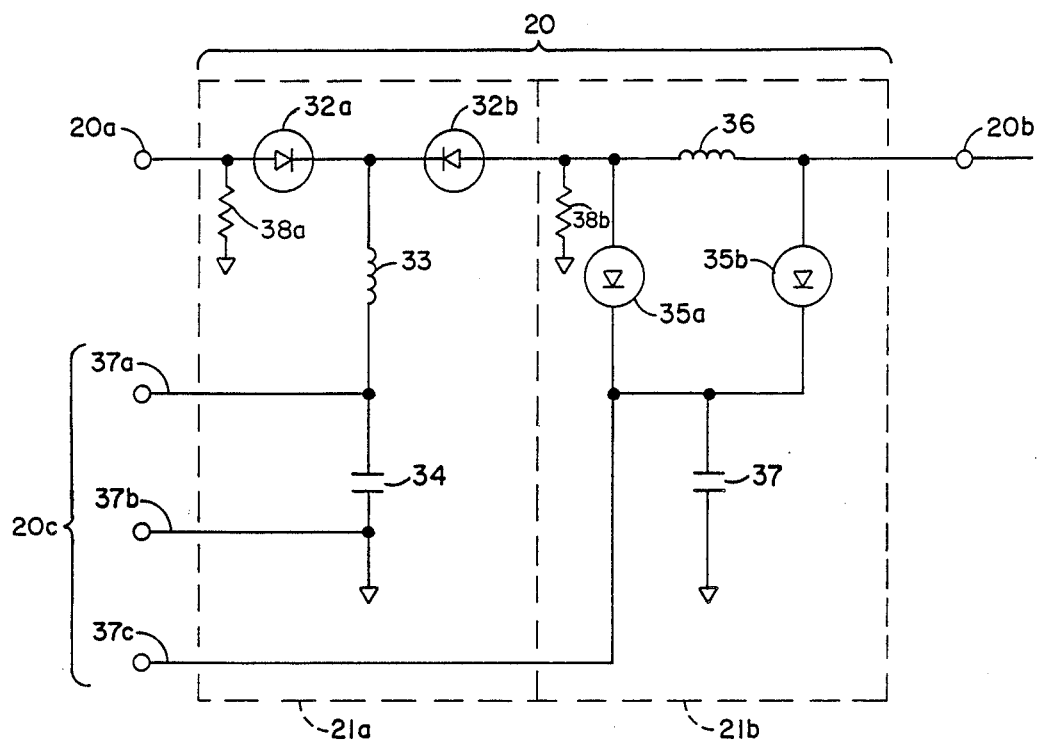
FIG. 2 is a schematic representation of a preferred embodiment of an analog phase shifter in accordance with the present invention.

Referring now to FIG. 2, a preferred embodiment for the analog phase shifter 20 is shown to include a first network 21a, here a T-section high pass filter network comprised of variable capacitor element 32a, 32b connected in series with input terminal 20a and a shunt element, here a fixed inductor element 33 connected to the common connection of elements 32a, 32b, and a fixed capacitor 34 which is coupled to ground and is used for D.C. blocking and r.f. by-pass. The high pass network 21a is disposed to have a cut-off frequency at or below the lowest frequency in the frequency pass band for the phase shifter 20. A variable DC voltage level is fed across the by-pass capacitor 34 via terminals 37a, 37b as shown. The variable voltage is used to provide a bias to capacitors 32a and 32b, here said capacitors 32a, 32b being variable capacitor diodes commonly referred to as varactors. A preferred technique for providing such variable capacitor (varactor) diodes will be described in conjunction with FIG. 7. Inductance element 33 is here provided by a length high impedance microstrip transmission line as is commonly known. To provide high values of inductance in a compact space, a spiral, microstrip transmission line may be provided as is also commonly known. Suffice it here to say that a variable DC voltage level is fed between terminals 37a and 37b to adjust the value of capacitance of each of the capacitive elements 32a, 32b in a predetermined manner as will be described. Such variable capacitors 32a, 32b when used in combination with the fixed inductance of element 33 imparts a predetermined phase shift to a signal propagated through the network 21a. Elements 38a, 38b provide D.C. return paths for the diodes, while blocking r.f. The elements may be an r.f. choke, high value resistor or λ/4 stub.

Network 21a is coupled to second network here a low pass π section comprised of a fixed series connected inductance 36 here provided as described above for element 33 which is connected to one end of the variable capacitive element 32b of network 21a, and a pair of shunt connected capacitive elements 35a, 35b here also voltage variable capacitors (i.e. varactor diodes) as described above for varactor diodes 32a, 32b. Low pass filter 21b has a cut-off frequency at or above the high frequency in the frequency pass band of the phase shifter 20. The capacitor elements 35a, 35b are coupled between the ends of series inductor 36 and an r.f. bypass D.C. blocking capacitor 37 which is coupled to ground, as shown. A second bias signal is provided between lines 37c and 37b to control the voltage bias provided to elements 35a, 35b and thus control the capacitance of such elements. A second predetermined phase shift is thus imparted to a signal propagating through the network by the capacitor elements 35a, 35b and inductor 36, as will now be described.

Figure 3:
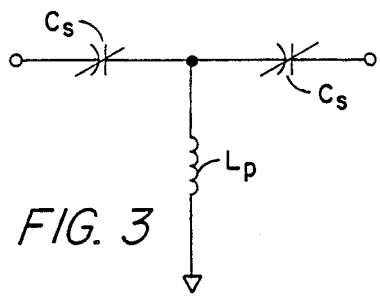
FIGS. 3–3B are a schematic and a pair of graphs which show the relationship between the element values for the network shown schematically in FIG. 3 as a function of and phase shift (FIG. 3A) and phase shift as a function of frequency (FIG. 3B)
Figure 3A:
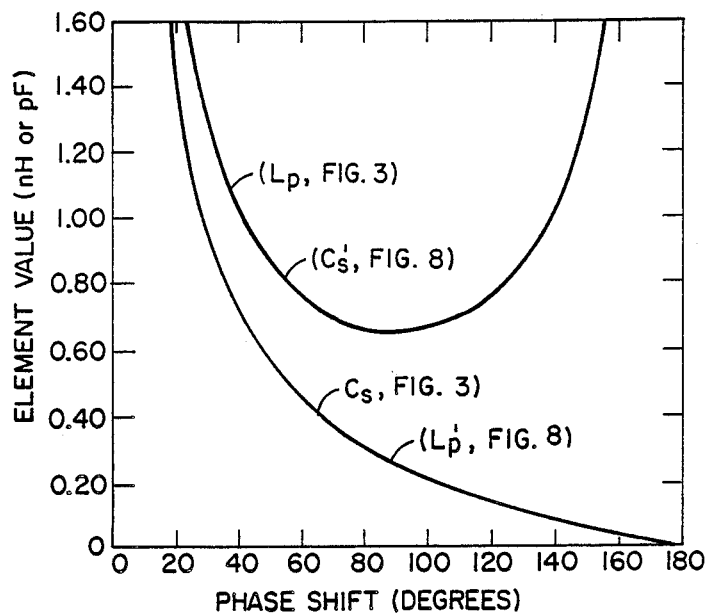
Figure 3B:
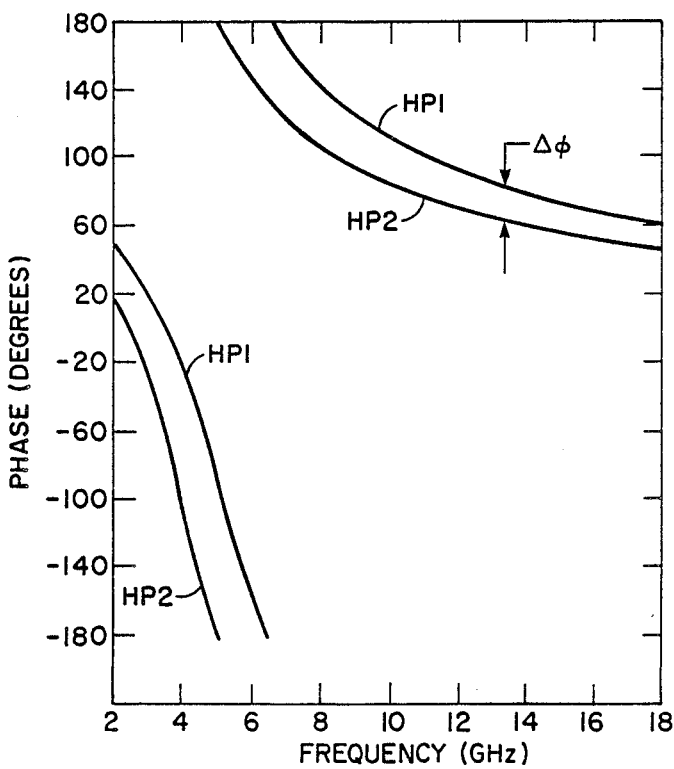

Referring now to FIGS. 3–3B, a simplified schematic representation the high pass filter element 21a (FIG. 2) is diagramatically shown as in FIG. 3. FIG. 3A shows a plot of ranges of inductance for element 33 and capacitance for elements 32a, 32b for the high pass network of FIG. 3 (network 21a, FIG. 2) to provide a predetermined range of phase shift variation at a frequency of here 12 GHz. Centered about 90° of phase shift and over approximately the range of 60°-120°, it is shown that the network in FIG. 3 may be modeled to having a substantially constant inductance for element $L_p$ and an approximately linear variable capacitance for elements $C_s$. Thus, by fixing the value of inductance of element $L_p$ and varying the value of capacitance for elements $C_s$, an insertion phase shift between 60° and 120° may be provided with this network, at 12 GHz. The insertion phase shifts for two of such networks each over the frequency range of at least 6-18 GHz are shown in FIG. 3B. The differential phase shift Δ φ of the two circuits decreases with increasing frequency.

Figure 4:
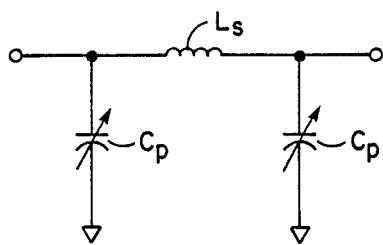
FIGS. 4–4B are a schematic and a pair of graphs showing the relationship between element values for the network shown schematically in FIG. 4 as a function of phase shift (FIG. 4A) and phase shift as a function of frequency (FIG. 4B)
Figure 4A:
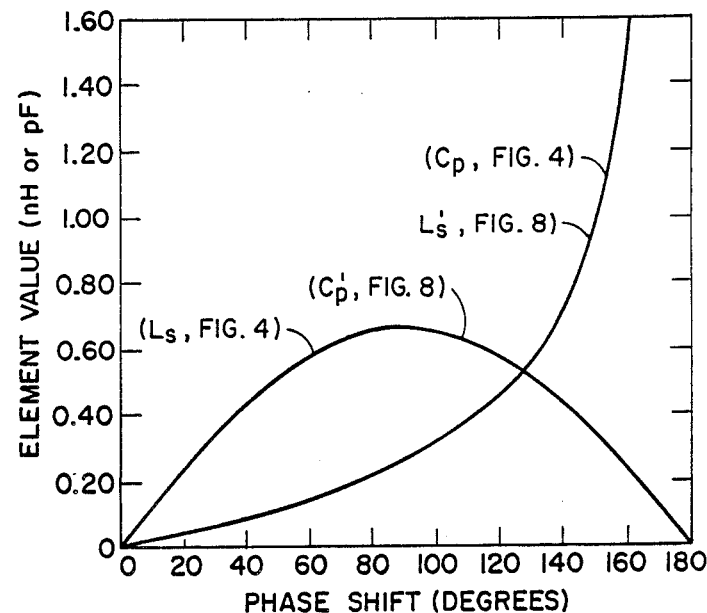
Figure 4B:
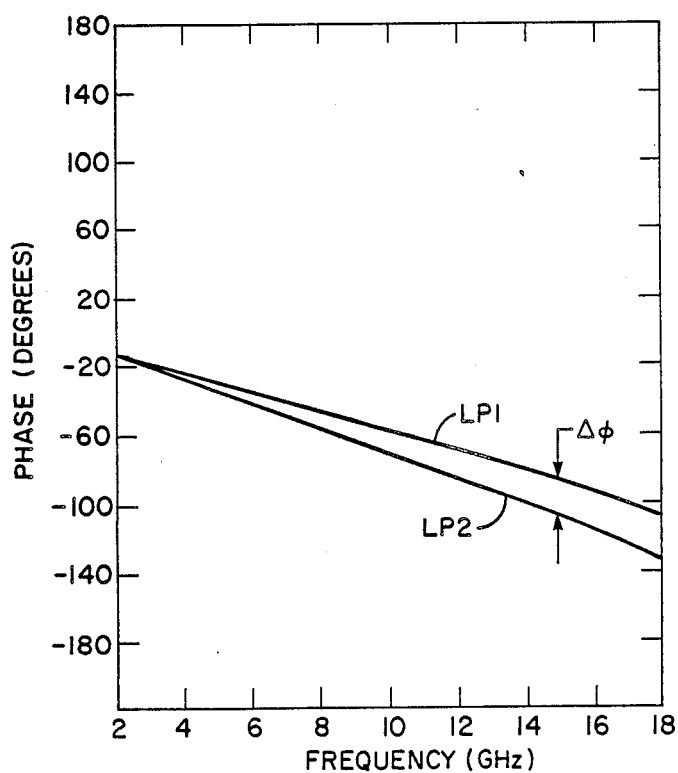

A similar analysis is conducted with the low pass filter element (FIG. 4) (21b, FIG. 2) as shown in conjunction with FIGS. 4-4B. In FIG. 4, the variable capacitor elements $C_p$ are shown coupled in shunt between a series, fixed inductor $L_s$ and ground. As shown in FIG. 4A, a plot of inductance for element $L_s$ (36, FIG. 2) and capacitance $C_p$ (35a, 35b, FIG. 2) indicates the required range of valves to produce a selected range of phase shift. Again, over the differential phase shift range of approximately 60°-120°, the value of inductance is substantially constant whereas the value of the capacitance varies as shown.

As shown in FIG. 4B, the phase shift characteristic over a frequency range of 2-18 GHz is shown. Unlike the frequency characteristic shown in FIG. 3B where differential phase shift, Δ φ, increases as a function of increasing frequency, here said differential phase shift decreases with increasing frequency. Thus, by cascade connecting the high pass and low pass filter sections together, a composite phase shift characteristic may be imparted to a signal propagating therethrough which provides a substantially constant differential phase shift over a broad range of operating frequencies i.e. 6-18 GHz.

Figure 5:
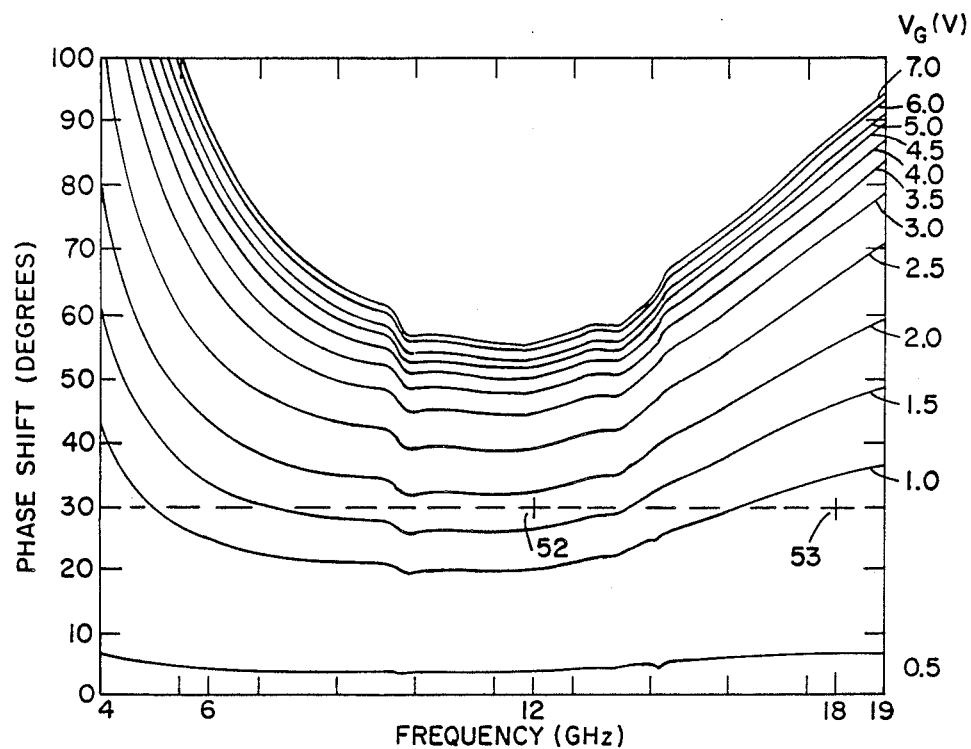
FIG. 5 is a plot showing differential phase shift as a function of frequency over the frequency range of 6–18

Referring now to FIGS. 5 and 6, a phase shift characteristic as a function of frequency for various control voltages between 0.5 volt to 7 volts in steps, as shown, and insertion loss of such circuit as in FIG. 2 for control voltages between 0-7 volts in voltage steps as indicated, is shown for a circuit having the elements as listed in the table.

TABLE

| Element | Value |
|---------|-------|
| $C_S$ | 1.5 pF–0.5 pF |
| $L_P$ | 1.32 nH |
| $C_P$ | .17 pF–.06 pF |
| $L_S$ | 0.58 nH |

The circuit was fabricated on 4 mil thick gallium arsenide substrate with the varactor diodes 20 of FIG. 2 provided by metal electrode semiconductor field effect transistors (MESFET) (as will be described in FIG. 7) having source and drain regions shorted together to provide an ohmic cathode region for the diode and gate fingers or electrodes providing a Schottky-barrier anode contact for the diodes. In this example, one low pass stage, and two high pass stages 21a were used to maintain the cut-off frequency below 6 GHz.

Thus, knowing the variation in differential phase shift as a function of frequency as shown in FIG. 5, it is a relatively simple task to choose values of control voltage to provide continuously variable phase shift of 45° such that when cascaded with the phase shifter 22 (FIG. 1) a continuously variable 0° to 360° phase shifter is provided.

Proper values of control voltage as a function of frequency would be stored in the beam steering controller 26 (FIG. 1) (not shown) and fed to the D/A converter 28 as in FIG. 1. Here a single value of control voltage is fed to both the high pass network 21a and the low pass network 21b.

Thus, as an illustrative example, if a phase shift of 210 were required, the digital phase shifter 22 would provide 180 in a manner as is commonly known and the analog phase shifter 20 would provide the remaining 30° by phase shift. If the signal frequency was 12 GHz, the control voltage would be approximately 1.75 V (point 52) whereas if the signal frequency was at 18 GHz, the control voltage would be approximately 0.92 V (point 53).

Alternatively, different valves for capacitors 32a, 32b, 35a, 35b (FIG. 2); $C_S$, $C_P$ (FIG. 3A, 4A) as well as inductors 33, 36 (FIG. 2); $L_P$, $L_S$ (FIGS. 3A, 4A) may be chosen to provide a flatter response over the operating frequency range. This would simplify system design requirements by reducing the number of values of control voltages which need be stored in the beam steering controller (FIG. 1).

A further alternative would be fed different control voltages to the circuit rather than the same voltages, as described above.

Referring to FIG. 7, 7A, a MESFET configured as a varactor diode 40 is shown to include a substrate 42 of semi-insulating gallium arsenide having a ground plane conductor 41 disposed over a first surface thereof and an N type here implanted active region 44 disposed over a second opposite surface thereof. Active region 44 is here a composite region including an active layer 44a having a dopant concentration in the range of $1 \times 10^{16}$ to $1 \times 10^{18}$ atom/cc here said concentration being preferable $1.8 \times 10^{17}$ and a contact layer 44b having a dopant concentration generally in excess of $1 \times 10^{18}$, here $1 \times 10^{18}$ being used. An anode contact 46 is provided from a plurality of parallel finger portions (not numbered). Conventional gate process techniques are used to provide the anode portions in a Schottky-barrier contact in recesses in the channel region 43a. The finger portions each had a length ($l_g$) of 0.5 microns. An ohmic cathode contact 48 comprised of finger portions (not numbered) interdigitated with the anode portions is formed using conventional source/drain processing techniques.

It has been found that such an arrangement provides suitable varactor diode characteristics. Moreover, such an arrangement is easily integrated with monolithic microwave integrated circuits. The inductance and capacitance values as given in the table were predicted from applying formulas described by Robert R. Garver in an article entitled "Broadband Diode Phase Shifters", IEEE MTT Vol. 20, No. 5 (May 1970). There the author describes prediction of phase shift from high pass and low pass filter circuits employed in switched FET phase shifter implementations.

Returning now to FIG. 1, a second application for the phase shifter elements as generally described above is also shown. Element 19 in the transceiver element 10 of FIG. 1 is here a low pass filter section similar in construction to that shown as element 21a in FIG. 2. Here element 19 is fed at terminal 19c by a fixed voltage bias $V_b$ provided by adjusting a potentiometer 29, for example. Element 19 is thus used to adjust the electrical pathlength between terminal 14a and 22b by changing the bias voltage value from potentrometer 29 and thus change the capacitance of the capacitors elements 35a, 35b (FIG. 2, section 21a).

This circuit is used to adjust the electrical pathlength through the transceiver element. Thus, in an array (not shown) incorporating many hundreds of such elements 10, the circuit is used to provide each one of said elements 10 with the same electrical pathlength to compensate for manufacturing tolerances. The transceiver elements 10 need be adjusted only once to provide electrical pathlength control to the element.

Referring now to FIG. 8, an alternate embodiment of a phase shifter 60 is shown to include a π-high pass network 62 having a fixed capacitance element $C_S'$ and a pair of variable inductances $L_P'$ connected as shown. The phase shifter is shown to further include a T-low pass network 64 having a fixed capacitance element $C_P'$ and a pair of variable inductance elements $L_S'$ connected as shown.

Here, the high pass network 62 may be similarly analyzed as the T-high pass network of FIGS. 3-3B except that the capacitor is here held constant and the inductor is allowed to vary. As shown in FIG. 3A, for capacitance ($C_S'$) of FIG. 8, the valve of capacitance is relatively constant over the phase shift range of 60°-120° as it was for inductance $L_P$ of FIG. 3. Thus, $C_S'$ (FIG. 8) is held constant and ($L_P'$) FIG. 8 is allowed to vary as was $C_S$ of FIG. 3 to provide an insertion phase shift over the range of 60° to 120°. Network 64 is similar to the π-low pass network of FIG. 4. An equivalent analysis may also be performed by making the capacitors constant (See FIG. 4A, $C_P'$) and varying the inductor (See FIG. 4A, $L_S'$). A variable inductor 70 may be provided by several techniques such as having substrate 42 carry a high remanent ferrite layer 72 having a conductor 74 disposed adjacent the layer. Here the conductor 72 is disposed over the layer. A D.C. current bias is fed to said conductor 74 to change the magnetization in said ferrite 72 as is commonly done in latching type waveguide phase shifters. Ferrites such as lithium ferrites may be used. Capacitors $C_S'$ $C_P'$ (FIG. 8 not shown, FIGS. 8A or 8B) may be provided by convention parallel plate capacitors as is generally known.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. An analog phase shifter comprising:
   at least one low pass π network comprising a fixed inductance element and a pair of variable capacitance elements as shunt elements thereof; and
   at least one high pass T network cascade connected to the low pass π network comprising a pair of variable capacitance elements connected in series and a fixed inductance element connected as the shunt element of the network.

2. The phase shifter of claim 1 wherein said variable capacitance elements have values of capacitance fixed inductance elements have values of inductance selected such that the cascaded networks provide a relatively constant phase shift characteristic as a function of frequency over the frequency bandwidth of the phase shifter.

3. The phase shifter of claim 2 wherein said variable capacitance elements in each network are varactor diodes.

4. The phase shifter of claim 3 wherein said varactor diodes include:
   a substrate supporting said cascaded networks;
   an active region supported by said substrate, said active region having active layer portions doped to a first carrier concentration in the range of $1 \times 10^{16}$ to $1 \times 10^{18}$ atoms/cc and contact layer portions doped to a carrier concentration of greater than $1 \times 10^{18}$ c/cc;
   a first contact disposed in Schottky-barrier contact over said active layer portions to provide an anode contact for said diode; and
   a second contact disposed in ohmic contact over said contact layer portions to provide a cathode contact for said diode.

5. An analog phase shifter comprising:
   at least one low pass T network said low pass T network comprising a fixed capacitance shunt element and a pair of variable inductance elements as series elements thereof; and
   and at least one high pass π network cascade connected with said low pass T network said high pass π network comprising a fixed capacitance element and a pair of variable inductance elements as shunt elements thereof.

6. The phase shifter of claim 5 wherein said variable inductance elements have values of inductance and fixed capacitance element has a value of capacitance selected such that the cascaded networks provide a relatively constant phase shift characteristic as a function of frequency over the frequency bandwidth of the phase shifter.

7. The phase shifter of claim 6 wherein said variable inductor element includes:
   a layer of ferrite having a remanent magnetization characteristic; and
   a conductor disposed to carry a D.C. bias current, disposed adjacent to said ferrite.

8. An analog phase shifter operable over a predetermined frequency band having a pair of terminals, comprising:
   a low pass π filter network having a cut-off frequency above the highest frequency in the predetermined frequency band, comprising:
      a fixed inductance element as a series element of said network; and
      a pair of variable capacitance elements connected to ends of said inductance element and coupled to a reference potential;
   a high pass T-network having a cut-off frequency below the lowest frequency in the predetermined frequency band; comprising:
      a fixed inductance element disposed as a shunt element of said network; and
      a pair of variable capacitance elements connected in series with said inductance element coupled between a common connection of said pair of variable capacitance elements and the reference potential; and
   wherein said π network and T-network are cascade interconnected between the pairs of terminals of said phase shifter.

9. The phase shifter of claim 8 wherein said variable capacitance elements are varactor diodes.

10. The phase shifter of claim 8 wherein said variable capacitance elements include:
    a substrate supporting said cascaded networks;
    an active region supported by said substrate, said active region having active layer portions doped to a first carrier concentration in the range of $1 \times 10^{16}$ to $1 \times 10^{18}$ and contact layer portions doped to a carrier concentrated of greater than $1 \times 10^{18}$ c/cc, with a first contact disposed in Schottky-barrier contact over said active layer portions to provide an anode contact for said diode; and a second contact disposed in ohmic contact over said contact layer portions to provide a cathode contact for said diode.

11. A phase array antenna element comprising:
an amplifier; and
a phase shifter coupled to said amplifier, said phase shifter including:
at least one low pass $\pi$ network having a variable insertion phase shift and having a cut-off frequency above the highest frequency in the predetermined frequency band comprising:
   a fixed inductance element as a series element of said network; and
   a pair of variable capacitance elements each connected to an end of said inductance element and coupled to a reference potential; and
at least one high pass T-network cascade connected to said at least one low pass $\pi$ network and having a variable insertion phase shift and a cut-off frequency below the lowest frequency in the predetermined frequency band, comprising:
   a fixed inductance element disposed as a shunt element of said network; and
   a pair of variable capacitance elements connected in series with said inductance element coupled between a common connection of said pair of variable capacitance elements and the reference potential.

12. The phase array element of claim 11 wherein said pair of variable capacitance elements are varactor diodes.

13. A transceiver element comprising:
means for steering electromagnetic energy between two terminals through a pair of signals paths;
means for imparting phase shift to electromagnetic energy passing therethrough coupled to a first end of said steering means, comprising:
a low pass filter $\pi$ network having a cut-off frequency above the highest frequency in the predetermined frequency band, comprising:
   a fixed inductance element as a series element of said network; and
   a pair of variable capacitance elements each connected to an end of said inductance element and coupled to a reference potential;
a high pass T-network having a cut-off frequency below the lowest frequency in the predetermined frequency band; comprising:
   a fixed inductance element disposed as a shunt element of said network; and
   a pair of variable capacitance element connected in series with said inductance element coupled between a common connection of said pair of variable capacitance element and the reference potential; and
   wherein said $\pi$ network and T-network are cascade interconnected between the pairs of terminals of said phase shifter.

14. A phase array antenna element comprising:
an amplifier; and
a phase shifter coupled to said amplifier, said phase shifter including:
at least one high pass $\pi$ network having a variable insertion phase shift, said high pass $\pi$ network having a cut-off frequency below the lowest frequency in a frequency band of said phase shifter, comprising:
   a fixed capacitance element disposed as a series element of said network; and
   a pair of variable inductance elements connected in shunt between said capacitance element and a reference potential; and
at least one low pass T-network cascade connected to said high pass $\pi$ network having a variable insertion phase shift and a cut-off frequency above the highest frequency in the predetermined frequency band, comprising:
   a fixed capacitance element as a shun element of said network; and
   a pair of variable inductance elements each connected to an end of said capacitance element.

* * * * *